Figure 1:
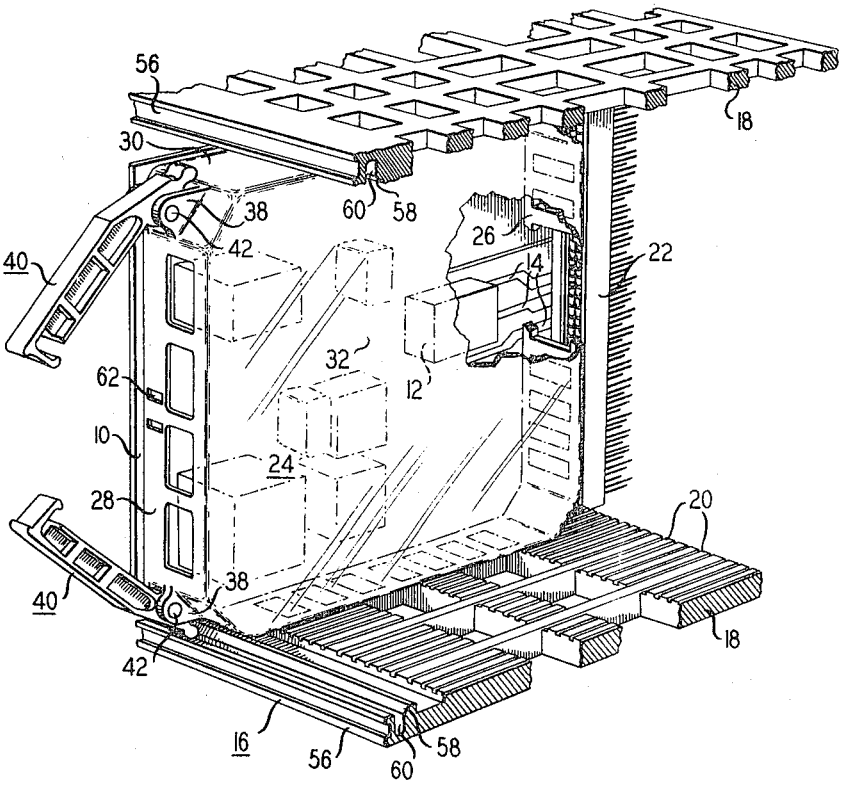
Figure 2:
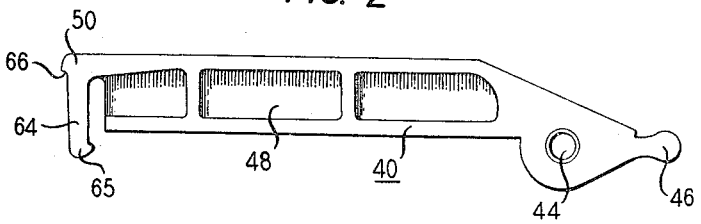
Figure 3:
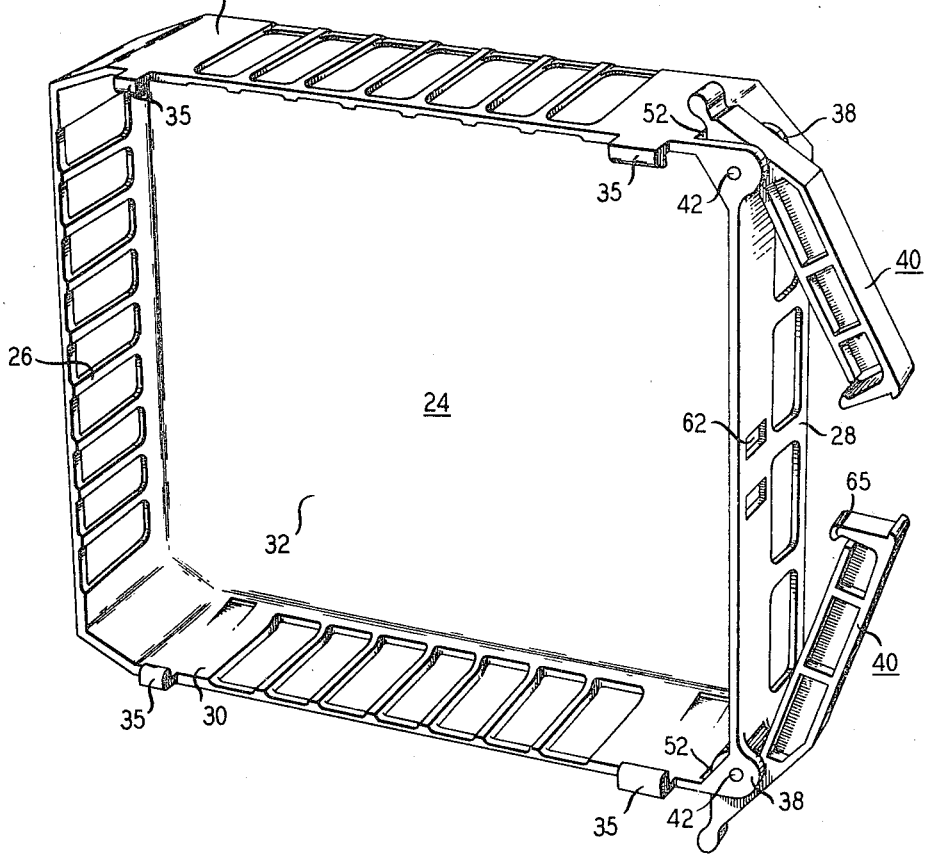
Figure 4:
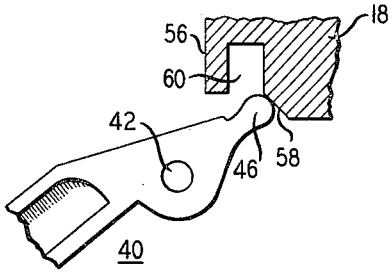
Figure 5:
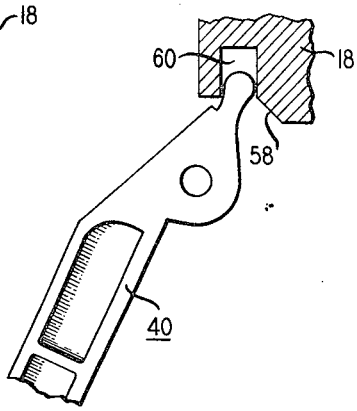
Figure 6:
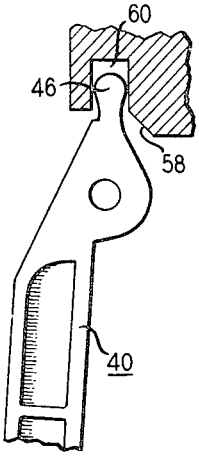

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JULY 28, 1970

876 O.G. 816

T876,004

CIRCUIT BOARD ATTACHMENT

John Andreini, Irvington, N.J., Edwin H. Borchard and Karl-Heinz Pohl, Boulder, Colo., and Joseph A. Puccio, East Brunswick, N.J., assignors to Bell Telephone Laboratories, Incorporated, Murray Hill and Berkeley Heights, N.J., a corporation of New York

Filed Dec. 29, 1969, Ser. No. 888,333

Int. Cl. H05k *7/14;* H01r *13/54, 13/62*

U.S. Cl. 339—45

2 Sheets Drawing. 9 Pages Specification

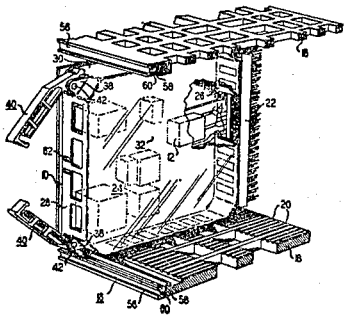

A protective cover that snaps onto a printed circuit board intended for mounting in a carrier. The cover includes a pair of levers that interact with the carrier to move the circuit board into and out of engagement with a connector mounted on the carrier.

July 28, 1970 J. ANDREINI ET AL T876,004

CIRCUIT BOARD ATTACHMENT

Filed Dec. 29, 1969 2 Sheets-Sheet 1

INVENTORS J. ANDREINI
E. H. BORCHARD
K. H. POHL
J. A. PUCCIO

BY Harry L. Newman
ATTORNEY

CIRCUIT BOARD ATTACHMENT

Filed Dec. 29, 1969 2 Sheets-Sheet 2